(12) United States Patent
Ang et al.

(10) Patent No.: US 9,177,903 B2
(45) Date of Patent: Nov. 3, 2015

(54) ENHANCED FLIP-CHIP DIE ARCHITECTURE

(71) Applicant: STMicroelectronics, Inc., Calamba (PH)

(72) Inventors: Bernie Chrisanto Ang, Batangas (PH); Bryan Christian Bacquian, Santa Rosa (PH)

(73) Assignee: STMicroelectronics, Inc., Calamba, Laguna (PH)

( * ) Notice: Subject to any disclaimer, the term of this patent is extended or adjusted under 35 U.S.C. 154(b) by 0 days.

(21) Appl. No.: 13/853,784

(22) Filed: Mar. 29, 2013

(65) Prior Publication Data

US 2014/0291842 A1 Oct. 2, 2014

(51) Int. Cl.
*H01L 21/00* (2006.01)
*H01L 23/498* (2006.01)
*H01L 21/56* (2006.01)
*H01L 25/065* (2006.01)
(Continued)

(52) U.S. Cl.
CPC ........ *H01L 23/49816* (2013.01); *H01L 21/568* (2013.01); *H01L 23/13* (2013.01); *H01L 23/49811* (2013.01); *H01L 25/0652* (2013.01); *H01L 25/0657* (2013.01); *H01L 25/50* (2013.01); *H01L 23/3128* (2013.01); *H01L 2224/131* (2013.01); *H01L 2224/1403* (2013.01); *H01L 2224/14181* (2013.01); *H01L 2224/16145* (2013.01); *H01L 2224/16225* (2013.01); *H01L 2224/32145* (2013.01); *H01L 2224/48091* (2013.01); *H01L 2224/48145* (2013.01); *H01L 2224/48227* (2013.01); *H01L 2224/73207* (2013.01); *H01L 2224/73253* (2013.01); *H01L 2224/73257* (2013.01); *H01L 2224/73265* (2013.01); *H01L 2224/92247* (2013.01); *H01L 2225/0651* (2013.01); *H01L 2225/06506* (2013.01); *H01L 2225/06513* (2013.01); *H01L 2225/06517* (2013.01); *H01L 2924/15151* (2013.01); *H01L 2924/15311* (2013.01)

(58) Field of Classification Search
CPC . H01L 2224/00; H01L 2225/00; H01L 24/00; H01L 21/00; H01L 2924/00; H01L 25/00
USPC .................. 257/777, 737, E21.499, E21.502, 257/E25.013, E25.018, 686, 778, E21.503, 257/787; 438/107, 109, 108, 124, 15, 613, 438/127, 110, 112, 51
See application file for complete search history.

(56) References Cited

U.S. PATENT DOCUMENTS 6,819,003 B2  11/2004  Farnworth
6,856,027 B2   2/2005  Wang
(Continued)

*Primary Examiner* — Telly Green
(74) *Attorney, Agent, or Firm* — Seed IP Law Group PLLC

(57) ABSTRACT

A method of assembling a multi-chip electronic device into a thin electronic package entails inverting a flip-chip die arrangement over a hollow substrate, stacking additional dies on the hollow substrate to form a multi-chip electronic device, and encapsulating the multi-chip electronic device. Containment of the encapsulant can be achieved by joining split substrate portions, or by reinforcing a hollow unitary substrate, using a removable adhesive film. Use of the removable adhesive film facilitates surrounding the multi-chip electronic device with the encapsulant. The adhesive film can also prevent encapsulant from creeping around the substrate to an underside of the substrate that supports solder ball pads for subsequent attachment to a ball grid array (BGA) or a land grid array (LGA).

14 Claims, 6 Drawing Sheets

(51) Int. Cl.
 *H01L 25/00* (2006.01)
 *H01L 23/13* (2006.01)
 *H01L 23/31* (2006.01)

(56) References Cited

U.S. PATENT DOCUMENTS

| | | | |
|---|---|---|---|
| 7,061,120 B2 | 6/2006 | Shin et al. | |
| 8,115,307 B2 | 2/2012 | Toyama et al. | |
| 8,143,097 B2 | 3/2012 | Chi et al. | |
| 8,304,878 B2 | 11/2012 | Appelt | |
| 2002/0105789 A1* | 8/2002 | Chen et al. | 361/767 |
| 2003/0127729 A1* | 7/2003 | Fukumoto et al. | 257/723 |
| 2004/0212068 A1* | 10/2004 | Wang | 257/686 |
| 2006/0051953 A1* | 3/2006 | Corisis et al. | 438/613 |
| 2006/0249828 A1* | 11/2006 | Hong | 257/686 |
| 2007/0096341 A1* | 5/2007 | Chung et al. | 257/784 |
| 2008/0042265 A1* | 2/2008 | Merilo et al. | 257/723 |
| 2010/0072602 A1* | 3/2010 | Sutardja | 257/686 |
| 2010/0240175 A1* | 9/2010 | Hong | 438/109 |
| 2010/0311208 A1* | 12/2010 | Sirinorakul et al. | 438/113 |
| 2011/0001240 A1* | 1/2011 | Merilo et al. | 257/738 |
| 2011/0031634 A1* | 2/2011 | Pagaila | 257/777 |
| 2011/0278713 A1* | 11/2011 | Appelt | 257/687 |
| 2012/0068229 A1* | 3/2012 | Bemanian et al. | 257/209 |
| 2012/0086050 A1* | 4/2012 | Bemanian et al. | 257/209 |
| 2012/0270368 A1* | 10/2012 | Lee et al. | 438/112 |
| 2013/0032948 A1* | 2/2013 | Park et al. | 257/774 |

* cited by examiner

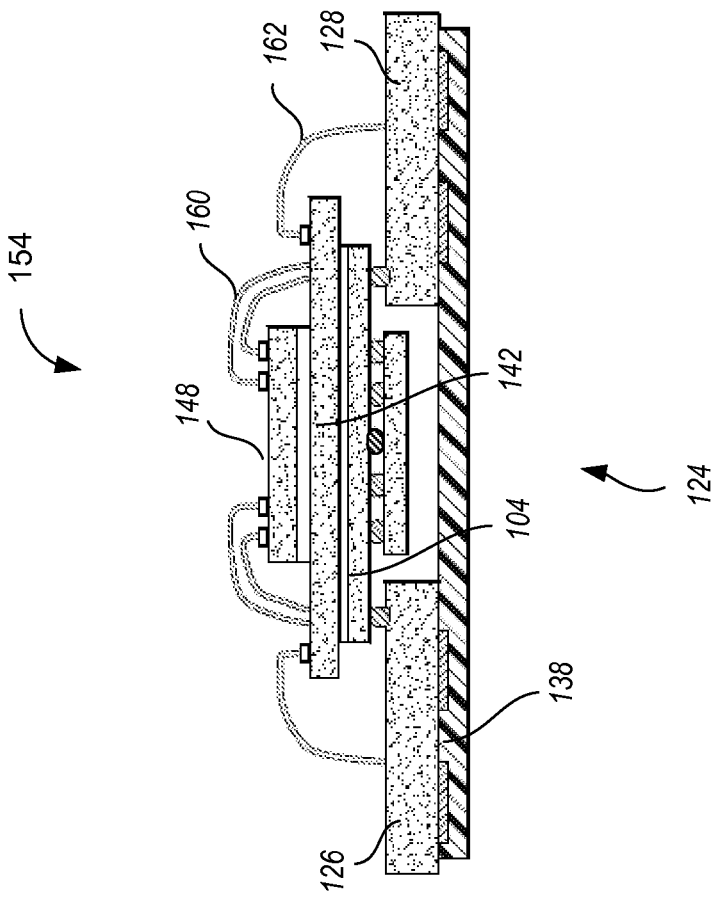
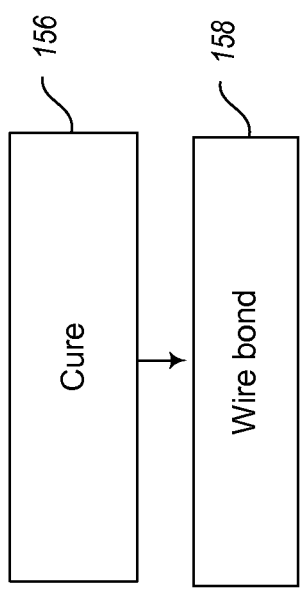
Fig. 5B
Fig. 5A

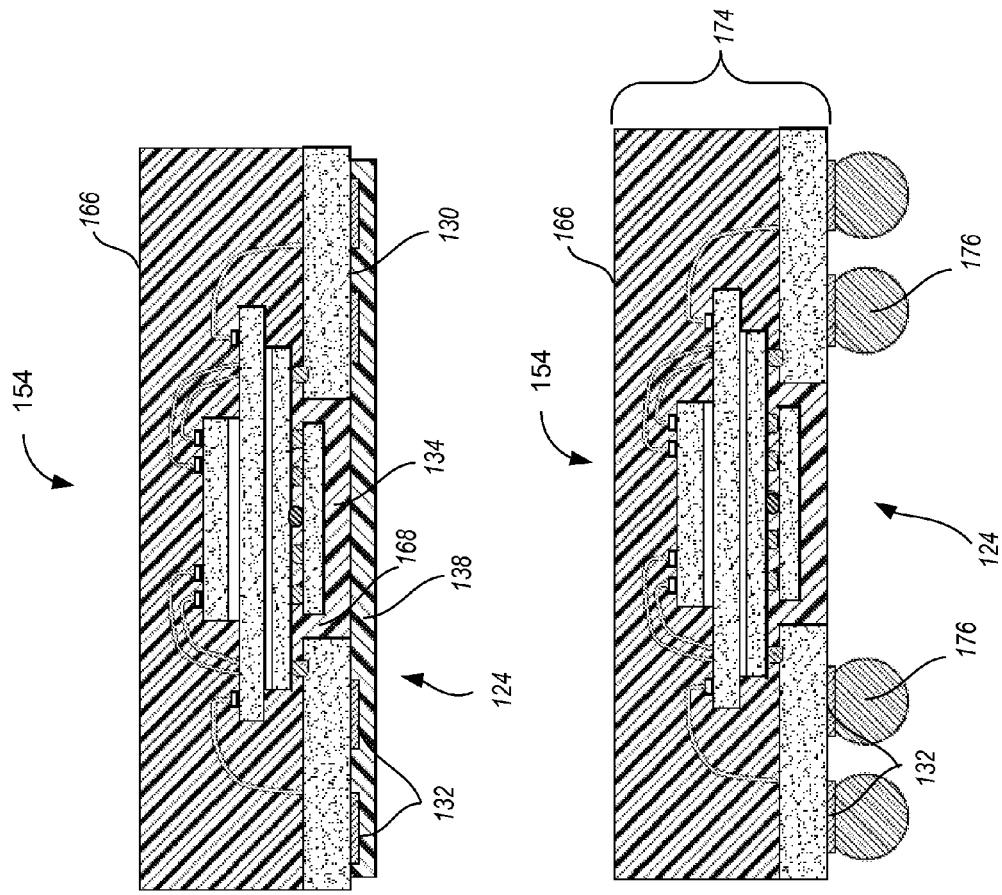
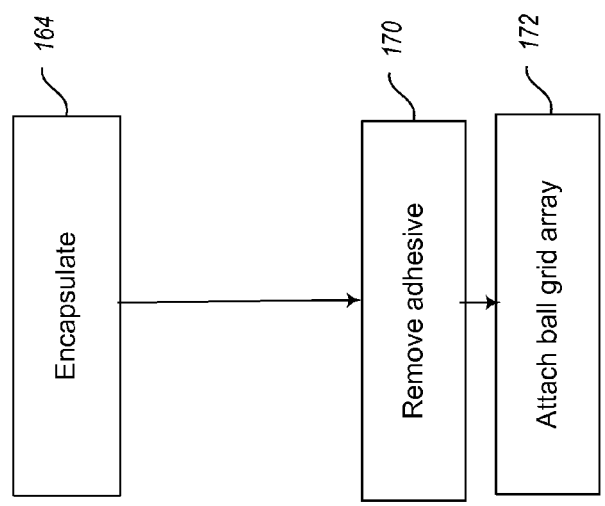
Fig. 6A
Fig. 6B

ENHANCED FLIP-CHIP DIE ARCHITECTURE

BACKGROUND

1. Technical Field

The present disclosure relates to electronic packaging of microelectronic devices.

2. Description of the Related Art

A trend in microelectronics packaging is reduction of the electronic package dimensions—both the package footprint and the package thickness—while continuing to provide greater functionality. It is now customary to stack multiple integrated circuit dice, electrically connect the dice using wire bonds, and encapsulate the stack into a single electronic package. The packaged multi-chip electronic device can then be surface-mounted to a printed circuit board (PCB) by forming a two-dimensional array of solder balls on an underside of the packaged device. Such PCBs can then be installed in, for example, mobile electronic devices such as smart phones, tablet computers, global positioning system (GPS) mapping devices, digital cameras, and the like. Each generation of such mobile devices demands smaller and thinner electronic packages, while providing more functions to consumers. Enhanced functionality requires more complex integrated circuits, and more dice stacked into the electronic package.

BRIEF SUMMARY

A method of assembling a multi-chip electronic device into a thin electronic package entails inverting a flip-chip die arrangement over an open region in a substrate carrier, stacking additional dies on the split substrate carrier, and encapsulating the multi-chip electronic device. The split substrate carrier can be a two-part substrate, a single substrate that has been split, or a hollow unitary substrate. Containment of the encapsulant in a split substrate can be achieved by joining split substrate portions using a removable adhesive film. Containment of the encapsulant in the split substrate can be reinforced by the adhesive. Use of the adhesive facilitates surrounding the multi-chip electronic device with the encapsulant. The adhesive can also prevent encapsulant from creeping around the substrate to an underside of the substrate that supports a solder ball connection pad (e.g., a ball grid array (BGA) or a land grid array (LGA)).

BRIEF DESCRIPTION OF THE SEVERAL VIEWS OF THE DRAWINGS

In the drawings, identical reference numbers identify similar elements. Sizes and relative positions of elements in the drawings are not necessarily drawn to scale.

FIG. 5A is a process flow diagram showing a further sequence of process steps that can be used to wire bond the four-die stack shown in FIG. 4B.

FIG. 5B is a cross-section view of a wire-bonded four-die stack formed by the process flow shown in FIG. 5A.

FIG. 6A is a process flow diagram showing a further sequence of process steps that can be used to complete formation of the packaged multi-chip electronic device described herein.

FIG. 6B is a sequence of side views of an encapsulated multi-chip electronic device, and a packaged multi-chip electronic device having an attached ball grid array, respectively, formed in succession by the process flow shown in FIG. 6A.

DETAILED DESCRIPTION

Figure 1:
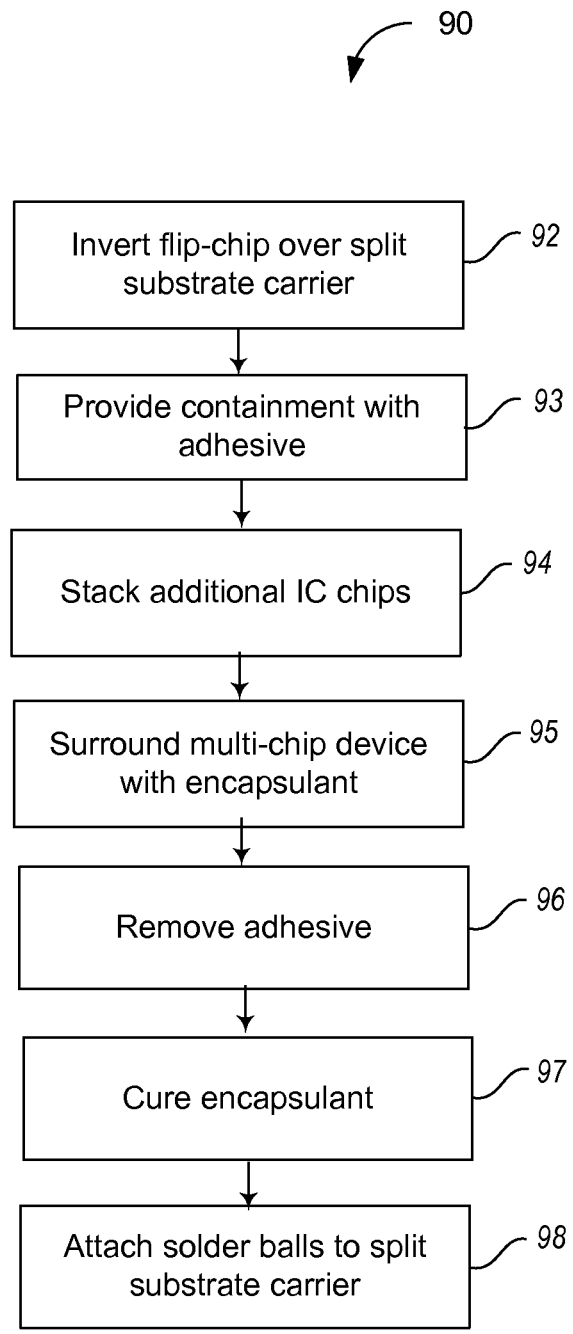
FIG. 1 is a high level flow diagram illustrating a process for packaging a multi-chip electronic device as described herein.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to insulating materials or semiconducting materials can include various materials other than those used to illustrate specific embodiments of the transistor devices presented. The term encapsulant should not be construed narrowly to limit an encapsulant to a molding compound, for example, but rather, the term "encapsulant" is broadly construed to cover any compounds that can be used to provide environmental protection for encapsulated circuitry.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, include a spin-expose-develop process sequence involving a photoresist. Such a photolithography sequence entails spinning on the photoresist, exposing areas of the photoresist to ultraviolet light through a patterned mask, and developing away exposed (or alternatively, unexposed) areas of the photoresist, thereby transferring a positive or negative mask pattern to the photoresist. The photoresist mask can then be used to etch the mask pattern into one or more underlying films. Typically, a photoresist mask is effective if the subsequent etch is relatively shallow, because photoresist is likely to be consumed during the etch process. Otherwise, the photoresist can be used to pattern a hard mask, which in turn, can be used to pattern a thicker underlying film.

In the description that follows, the terms "dies," "dice," "chips" "semiconductor chips," and "integrated circuit chips" are used interchangeably. Specific embodiments are described herein with reference to examples of electronic packages that have been produced; however, the present disclosure and the reference to certain materials, dimensions, and the details and ordering of processing steps are exemplary and should not be limited to those shown.

FIG. 1 shows a high-level packaging process 90 for packaging a multi-chip electronic device according to one embodiment described herein. The packaging process 90 permits assembly of a multi-chip electronic device into a thin package.

At 92, a flip-chip die arrangement is inverted over a split substrate carrier. In one embodiment, the split substrate carrier is a hollow substrate in which a trough or a cavity has been formed. Alternatively, the split substrate can be a two-part substrate comprising two detached portions. As a further alternative, the split substrate can be two independent die, which are each fully functional circuits on their own substrates that are brought close to each other, with a selected space between them. The two separate substrates are placed with a set distance between them, thus have a split that separates them. This is therefore one more example of a split substrate. The flip-chip die arrangement includes at least two integrated circuit chips, thus constituting a multi-chip electronic device.

At 93, an adhesive can be attached to an underside of the split substrate carrier. If the split substrate carrier is for two different die, the adhesive joins the two die, each of them being one portion of the split substrate. These two portions provide containment for an encapsulant. If the split substrate carrier has a continuous underside, as would be the case for a hollow substrate, with a recess to provide the hollow region, the adhesive may not be needed, and if so, it is not used; however, if desired, the adhesive provides structural reinforcement to enhance containment for an encapsulant. The adhesive may be in the form of an adhesive tape, or an adhesive film, for example.

At 94, additional integrated circuit chips can be stacked on the split substrate carrier to add functionality to the multi-chip electronic device.

At 95, the multi-chip electronic device can be surrounded by an encapsulant. The encapsulant may be, for example, a standard molding compound, or a specialized molding compound having a selected viscosity. The encapsulant is intended to fill a hollow part of the hollow substrate carrier. A curing process may be used to harden the encapsulant and strengthen the package.

At 96, the adhesive can be removed.

At 97, the encapsulant can be cured to solidify or harden the encapsulant material.

At 98, solder balls can be attached to the underside of the split substrate carrier for subsequent mounting onto a PCB.

Details of the packaging process 90 are presented below, with reference to FIGS. 2A-6B.

Figure 2B:
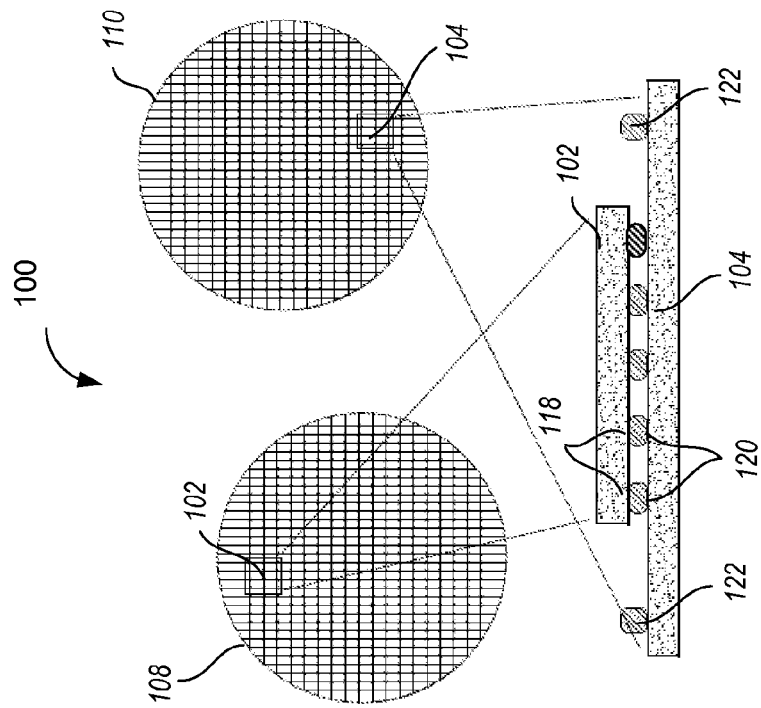
FIG. 2B is a cross-section view of a two-die stack profile formed by the process flow shown in FIG. 2A.
Figure 2A:
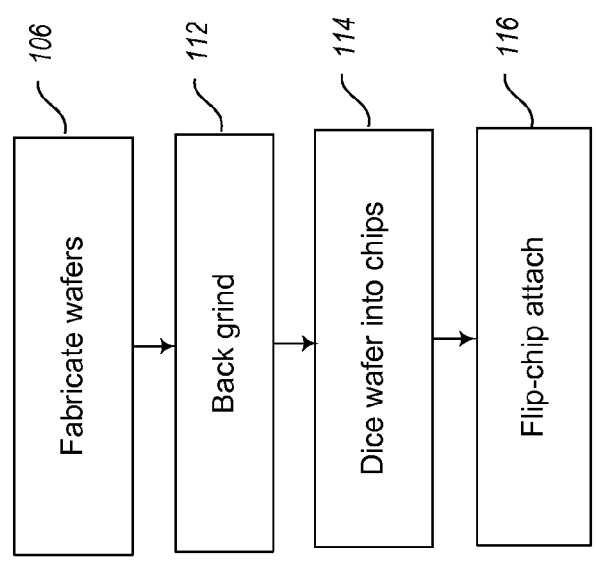
FIG. 2A is a process flow diagram showing a sequence of process steps that can be used to join a pair of integrated circuit chips using a conventional flip-chip die attach process.

FIGS. 2A and 2B describe and show a flip-chip die attach arrangement 100 that includes first and second integrated circuit chips 102 and 104, respectively. The integrated circuit chips 102 and 104 contain circuitry for providing various functions such as, for example, digital or analog signal processing, memory, wireless communications, and the like. The integrated circuit (IC) chips 102 and 104 are, in general, two different types of IC chips.

At 106, the IC chips 102 and 104 can be fabricated on separate semiconductor wafers 108 and 110 respectively, (e.g., silicon wafers, III-V semiconductor wafers, etc.). However, the IC chips 102 and 104 could potentially be the same type of IC chips, for example, two memory chips, or two processors. Following the wafer fabrication process 106, post-processing steps may include back grinding the wafers (112) and sawing the wafers (114) into the individual first and second IC chips 102 and 104.

At 116, the first IC chip 102, sometimes called the daughter, can be joined to the second IC chip 104, sometimes called the mother, using a process which is well known to those skilled in the art as a flip-chip die attach process. In a flip-chip die attach process, instead of using wire bonds to electrically couple circuitry on the respective dies, a matrix of solder balls 118 can be fabricated on a side of the first IC chip 102, for attachment to bond pads 120 formed on a side of the second IC chip 104. In turn, an arrangement of solder balls 122 (e.g., one or more arrays) can be formed around a perimeter of the second IC chip 104 for subsequent attachment to a split substrate carrier as shown below.

Figure 3B:
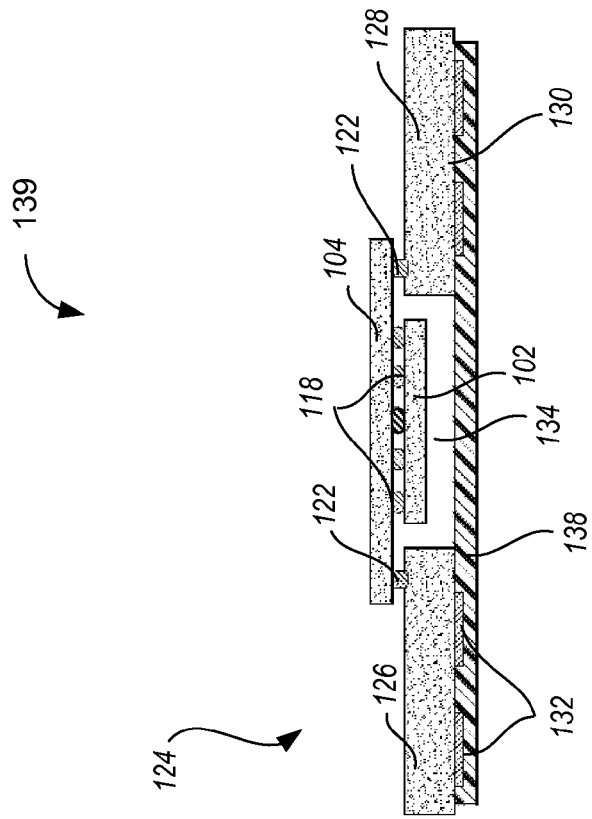
FIG. 3B is a cross-section view of a flip-chip die arrangement inverted over the hollow substrate carrier, as formed by the process flow shown in FIG. 3A.
Figure 3A:
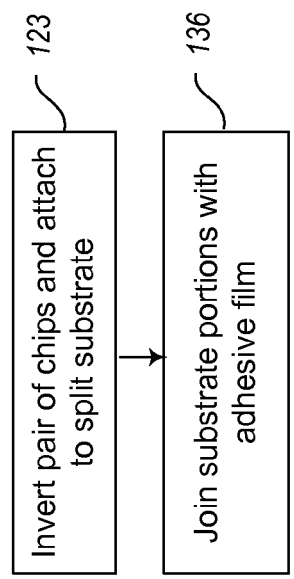
FIG. 3A is a process flow diagram showing a further sequence of process steps that can be used to provide temporary containment for an encapsulant to fill a split substrate carrier.

With reference to FIGS. 3A and 3B, at 123, the flip-chip die attach arrangement 100 can be inverted and attached to a split substrate carrier via the solder balls 122. In the embodiment shown, the split substrate carrier is in the form of a two-die split substrate 124 having a left die 126 and a right die 128. However, the split substrate carrier may otherwise be a unitary substrate in which a trough or a cavity is formed as a hollow part of the substrate. The hollow substrate carrier can be made of a polymer material such as that which is used to make printed circuit boards (PCBs). Alternatively, the split substrate carrier can be a semiconductor substrate.

In the embodiment shown in FIG. 3B, the split substrate 124 is composed of two separate and independent die 126 and 128. Each of these die 126 and 128 are composed of operating semiconductor circuits, such as logic or microprocessor circuits each formed in a monocrystalline silicon substrate. The two die 126 and 128 are brought adjacent to each other and positioned for coupling to a carrier or adhesive 138 having a selected space 134 between them. In this embodiment, as shown, the operating circuits on 126 and 128 will also provide electrical output via bond pads 120, as explained later herein. Accordingly, there is a bond pad on a first surface of each of 126 and 128, respectively, to receive the solder balls 122 from the flip-chip die 104. These signals can be processed and handled by the logic circuitry in their respective die 126 and 128 or, alternatively, can be routed through to the bond pads 120, depending on the function of the circuit and the design characteristics.

In another alternative, the split substrate may be two substrates which have no logic circuits thereon, and merely perform the substrate support function and provide electrical connection from the die 104 to the bond pads 120. As a further alternative, in one embodiment the split substrate 124 may include portions 126 and 128, which are actually two parts of the same substrate, which extend as fingers during the assembly process but are subsequently severed from a larger unitary substrate during a final dicing step. The split substrate 124 can therefore be composed of any two suitable electrically conductive components 126 and 128 having electrical traces which are placed adjacent to each other having a selected space 134 therebetween to receive the flip-chip assembly of dies 104 and 102.

In one embodiment, the ball pads 132 extend from the bottom of substrates 126 and 128 as shown. In another embodiment, they are flush with the bottom of substrates 126 and 128 and do not extend past the bottom surface. Namely, they are recessed into the substrates instead of extending out of them.

An underside 130 of the split substrate 124 further includes solder ball pads 132 for electrically coupling to a ball grid array as described below. The solder ball pads 132 are thus made of a conductive material that bonds with solder, such as a metal typically used for interconnect circuitry, e.g., copper, aluminum, AlCu alloys, and the like. The left and right substrate portions 126 and 128 of the split substrate 124 are spaced apart from one another by a gap 134, over which the first IC chip 102 is suspended such that the first IC chip 102 extends into the gap 134.

At 136, the left and right substrate portions 126 and 128 of the split substrate 124 can be joined using an adhesive 138 to bridge the gap 134. The adhesive can be attached to the underside 130 of each of the left and right substrate portions 126 and 128. The adhesive 138 can be an adhesive tape such as an acrylic tape. Alternatively, the adhesive 138 can be an adhesive film that is deposited or dispensed as a liquid and then cured, such as polyimide film. The adhesive 138 can have a thickness of about 200 µm so that it covers and protects the solder ball pads 132. The resulting structure shown in FIG. 3B can be structured as a two-die or a four-die multi-chip stack 139. Alternatively, the structure shown in FIG. 3B can be a four-die multi-chip stack.

In one embodiment, substrate portions 126 and 128 merely provide electrical conductivity from the flip-chip arrangement to the solder ball pads 132. Alternatively, in the embodiment shown, substrates 126 and 128 are active electrical die which contain logic circuits, and thus provide an additional two die in the multi-chip stack 139, making, in the example shown in FIG. 3B, a four-die multi-chip stack 139.

Figure 4B:
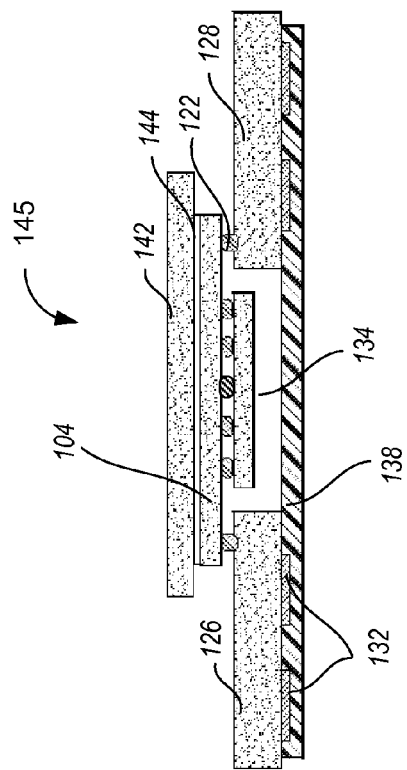
FIGS. 4B and 4C are a sequence of cross-section views of a three-die stack profile and a four-die stack profile, respectively, formed in succession by the process flow shown in FIG. 4A.
Figure 4C:
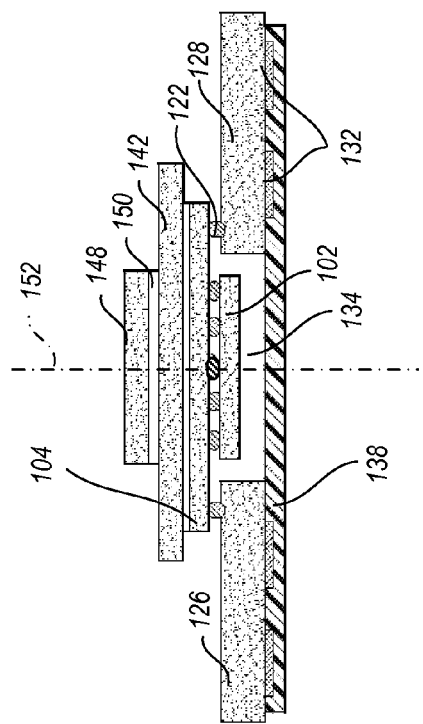
Figure 4A:
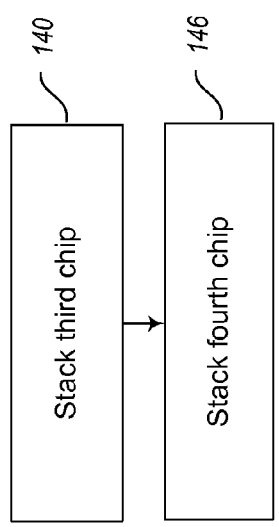
FIG. 4A is a process flow diagram showing a further sequence of process steps that can be used to stack additional dice onto the hollow substrate carrier.

With reference to FIGS. 4A, 4B, and 4C, at 140, a third integrated circuit chip 142 can optionally be stacked on top of the second IC chip 104 and secured with a first glue layer 144, e.g., a conventional die film attach (DAF) adhesive material. Such a material is available from, for example, the Dow Corning Corporation of Midland, Mich. The resulting structure shown in FIG. 4B is a three-die multi-chip stack 145.

At 146, a fourth integrated circuit chip 148 can optionally be stacked on top of the third IC chip 142 and secured with a second glue layer 150. Desirably, each of the first, second, third, and fourth IC chips are placed so that they are approximately centered laterally about a central axis 152. The third and fourth IC chips 142 and 148 can provide additional functionality to the overall multi-chip electronic device. The resulting structure shown in FIG. 4C is a six-die multi-chip stack 154; however, it can be a three- or four-die stack if split substrate portions 126 and 128 are not die and if die 142 is merely an interposer board. In some embodiments, additional IC chips can be added to the four-die multi-chip stack 154.

With reference to FIGS. 5A and 5B, at 156 the multi-chip stack 154 can be cured using a standard electronic package curing technique which can set the glue (e.g., DAF).

At 158, wire bonds 160 can be attached between some or all of the IC chips (e.g., 104, 142, and 148) that are joined by the glue layers, (e.g., 144 and 150). Additional wire bonds 162 can be attached between such IC chips and the split substrate 124.

In the example shown in FIG. 5B, bond wires 160 are shown going from a top die 148 to an intermediate die 142. Of course, the bonding wires 160 could extend from the top die 148 all the way to the split substrate 126 and 128. In the embodiment in which the split substrate 126 and 128 are composed of fully functional integrated circuit dies, the placement of the bonding wires on the split substrate portions 126 and 128 will be to the appropriate bonding pads and will provide for interconnection of the electrical functionality of the six-die with respect to each other, thus drastically reducing the electrical interconnection that must take place outside of the packaged stack. For example, if die 142 is a highly complex microprocessor, and dies 126 and 128 contain memory chips for interaction with the processor, then all the interconnections between the processor and the memory can take place inside the encapsulated package. Encapsulated signals are fed out through the bond pads 120 of the split substrate portions 126 and 128. Some of the bond pads 120 may be processed directly to the microprocessor die 142, while others provide address and data pins to the memory circuits 126 and 128.

The designer of the die can use their design skills to select the location and type of die to be used in the multi-chip package. For example, in some instances it may be desired to have the bonding pads on the memory chips as in the example shown in FIG. 5B, with separate die 126 and 128. Alternatively, the die 126 and 128 may be simply A-D converters which convert analog data in some portions to digital data so that it may be handled by the digital logic circuits on the respective die 142 and 148 in the package. Alternatively, the split substrate portions 126 and 128 may be merely interconnection substrates that contain trace lines in order to provide electrical connection to the bonding pads 132 and do not, in and of themselves, contain any transistors or other integrated circuit components.

FIGS. 6A and 6B describe an encapsulation process 164 that can be facilitated by the presence of the adhesive 138. At 164, an encapsulant 166 (e.g., a molding compound) can be set to flow around the multi-chip stack 154 so as to fill space surrounding the multi-chip stack 154, including filling the gap 134 underneath the multi-chip stack 154, referred to by the term underfill. Achieving a successful underfill, in which a viscous liquid encapsulant reaches and fills interstitial spaces around the multi-chip stack 154, is facilitated by the adhesive 138 providing containment of the encapsulant. If the split substrate carrier is a unitary substrate, such as a hollow substrate, the adhesive 138 can provide reinforcement to the underside of the hollow substrate carrier, which reinforced containment can prevent warpage, or alternatively, no adhesive 138 is used. Such containment or reinforced containment ensures that the volume of encapsulant is not reduced by leakage through the gap 134. Furthermore, containment by the adhesive 138 in particular ensures that the volume of encapsulant 166 is not reduced by the encapsulant creeping around the split substrate 124 to the underside 130 of the split substrate 124. Still further, use of the adhesive 138 protects the solder ball pads 132 from coming into contact with the encapsulant 166. Contact of the solder ball pads 132 with the encapsulant 166 may chemically contaminate the solder ball pads 132, which could compromise their electrical conductivity. Additionally or alternatively, contact of the solder ball pads 132 with the encapsulant 166 may leave behind a residue that could compromise electrical conductivity by blocking or restricting current flow at the surface of the solder ball pads 132. Use of the adhesive 138 can address these concerns.

The encapsulation process 164 can be further facilitated by judicious placement of the multi-chip stack 154 with respect to the gap 134. In particular, achieving a successful underfill of the encapsulant 166 into the gap 134 depends on passing the encapsulant 166 through a narrow entrance 168 between the suspended first IC chip 102 and the split substrate 124, the narrow entrance 168 being about 0.1 µm wide. Thus, control and selection of the dimensions of the first and second IC chips 102 and 104 during the wafer sawing process 114 can be a factor affecting underfill. In addition, accurate and precise registration of the first IC chip 102 relative to the second IC chip 104 during the flip-chip die attach process 116 can also be a factor affecting the underfill. Furthermore, accurate and precise registration of the inverted flip-chip die arrangement 100 relative to the split substrate 124 during the attachment process 123 can be a factor affecting the underfill.

An encapsulant 166 having a lower viscosity may be used to improve underfill capability. Typically, the flip-chip die attach process uses a specialized molding compound. Molding compounds are typically made of polymer resin, composed of 80%-90% fillers having diameters within the range of about 55-75 µm. With the use of a hollow substrate carrier, an ordinary molding compound can be used instead. Ordinary molding compounds tend to have a smaller filler size or a distribution of fillers that improves flowability through the narrow entrance 168.

It is noted that the narrow entrance 168 might experience a large degree of mechanical stress, which can be observed during thermal cycling. One reason for such stress may be a difference in the coefficients of thermal expansion for different materials such as silicon, solder, and molding compound that may all be present near the narrow entrance 168. When encapsulant is present at the narrow entrance 168 and replaces the substrate material in the gap 134, the encapsulant can absorb and thereby reduce some of the mechanical stress.

The encapsulating process 164 may optionally include one or more curing steps that accelerate solidification of the encapsulant 166, depending on the encapsulant material used. The curing steps may occur at any process step following the encapsulation step.

At 170, once the encapsulant is stable, the adhesive 138 can be removed. If the adhesive 138 is an adhesive tape, the tape may be removed by manually pulling off the tape. If the adhesive 138 is an adhesive film such as, for example, a polyimide film, the adhesive 138 may be removed, for example, either by peeling off the adhesive film, or by dissolving the adhesive film in a fluid remover. If the adhesive film material is photo-sensitive, the fluid remover can be a developer. Otherwise, the fluid remover can be a wet chemical etchant or a plasma etchant. A final thickness 174 of the packaged multi-chip electronic device can be about 600 µm. This final thickness represents a significant reduction in thickness of over 50% or more, compared with available electronic packages for a four-die multi-chip stack 154. It may be a reduction of over 100% for a six-die stack. Such a reduction in thickness provides flexibility to either include an additional die or simply provide a thinner packaged product.

At 172, solder balls 176 can be attached to the underside 130 of the split substrate 124 at the protected surfaces of the solder ball pads 132 using a conventional attach process. The solder balls 176 can be in the form of a ball grid array (BGA) or a land grid array (LGA). The solder balls 176 can have a diameter of about 250 µm.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of packaging a multi-chip electronic device, the method comprising:
   fabricating a split substrate having left and right substrate portions spaced apart from one another by a gap;
   joining the left and right substrate portions by attaching an adhesive to an underside of each substrate portion to bridge the gap and to cover solder ball pads located on the undersides of the split substrate;
   joining a plurality of integrated circuit chips to each other using a flip-chip die attach process;
   attaching a pair of the plurality of integrated circuit chips to the split substrate to form a multi-chip electronic device in which one chip is suspended within the gap, a lower surface of the suspended chip being held substantially above the undersides of the split substrate so a not to contact the adhesive;
   wire-bonding one or more of the pair of the plurality of integrated circuit chips to the split substrate;

encapsulating the multi-chip electronic device with the adhesive present to protect the solder ball pads from coming into contact with an encapsulant;

removing the adhesive from the right and left substrate portions; and attaching solder balls to surfaces of the protected solder ball pads.

2. The method of claim 1 wherein the encapsulating entails flowing the encapsulant so as to surround the multi-chip electronic device and fill the gap.

3. The method of claim 2 wherein flowing the encapsulant includes passing the encapsulant through an entrance between the suspended chip and the split substrate, the entrance being about 0.1 μm wide.

4. The method of claim 2 further comprising the adhesive, together with the split substrate, providing containment for the encapsulant.

5. The method of claim 1 further comprising, prior to the encapsulating, attaching one or more additional integrated circuit chips to the multi-chip electronic device and wire-bonding the integrated circuit chips to one another.

6. The method of claim 1 wherein the adhesive is a polyimide film.

7. The method of claim 1 wherein the adhesive is an acrylic tape.

8. The method of claim 1 further comprising curing the multi-chip electronic device prior to attaching the solder balls.

9. A method of packaging a multi-chip electronic device, the method comprising:

inverting a flip-chip die arrangement over a hollow substrate carrier;

providing containment for an encapsulant by attaching an adhesive to an underside of the hollow substrate carrier;

surrounding the multi-chip electronic device with the encapsulant; and removing the adhesive.

10. The method of claim 9 wherein the hollow substrate carrier is a split substrate.

11. The method of claim 9 further comprising, after attaching the adhesive, stacking additional integrated circuit chips on the hollow substrate carrier.

12. The method of claim 9 further comprising curing the encapsulant.

13. The method of claim 9 wherein the adhesive is made of a polyimide film.

14. The method of claim 9 further comprising attaching solder balls to solder ball pads on the underside of the hollow substrate carrier.

* * * * *